(12) United States Patent
Xie et al.

(10) Patent No.: US 9,529,252 B2
(45) Date of Patent: Dec. 27, 2016

(54) MASK PLATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenyu Xie, Beijing (CN); Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 64 days.

(21) Appl. No.: 14/395,711

(22) PCT Filed: Dec. 4, 2012

(86) PCT No.: PCT/CN2012/085860
§ 371 (c)(1),
(2) Date: Oct. 20, 2014

(87) PCT Pub. No.: WO2014/000380
PCT Pub. Date: Jan. 3, 2014

(65) Prior Publication Data
US 2015/0079503 A1   Mar. 19, 2015

(30) Foreign Application Priority Data
Jun. 29, 2012 (CN) .......................... 2012 1 0226736

(51) Int. Cl.
| G03F 1/50 | (2012.01) |
| G03F 1/00 | (2012.01) |
| G02B 27/09 | (2006.01) |

(52) U.S. Cl.
CPC ............. *G03F 1/50* (2013.01); *G02B 27/0988* (2013.01); *G03F 1/00* (2013.01)

(58) Field of Classification Search
CPC ....................................................... G03F 1/50
USPC ............................................................ 430/5
See application file for complete search history.

(56) References Cited

U.S. PATENT DOCUMENTS

| 5,731,109 A | 3/1998 | Hwang |
| 5,827,623 A | 10/1998 | Ishida et al. |
| 6,033,811 A | 3/2000 | Lee |
| 6,403,477 B1 | 6/2002 | Tounai |

(Continued)

FOREIGN PATENT DOCUMENTS

| CN | 1164673 A | 11/1997 |
| CN | 101105633 A | 1/2008 |

(Continued)

OTHER PUBLICATIONS

International Preliminary Report on Patentability dated Dec. 31, 2014; PCT/CN2012/085860.

(Continued)

*Primary Examiner* — Stephen Rosasco
(74) *Attorney, Agent, or Firm* — Ladas & Parry LLP

(57) ABSTRACT

A mask plate is used for implementing a graphic structure with a narrower line width on a target substrate. The mask plate includes a slit-shaped photic area and a lightproof area. An edge of the slit-shaped photic area is in a curve shape.

17 Claims, 7 Drawing Sheets

(56) References Cited

U.S. PATENT DOCUMENTS

| | | | |
|---|---|---|---|
| 2009/0109364 A1 | 4/2009 | Yang et al. | |
| 2010/0178599 A1* | 7/2010 | Kim | G03F 1/144 430/5 |
| 2011/0269060 A1* | 11/2011 | Shishido | G03F 1/36 430/5 |

FOREIGN PATENT DOCUMENTS

| | | |
|---|---|---|
| CN | 101424882 A | 5/2009 |
| CN | 102749801 A | 10/2012 |
| JP | 56156636 A | 12/1981 |
| JP | 0653159 A | 2/1994 |
| JP | 09127677 A | 5/1997 |
| JP | 11231506 A | 8/1999 |
| KR | 2001005225 A | 6/2001 |
| KR | 20090043048 A | 5/2009 |

OTHER PUBLICATIONS

First Chinese Office Action Appln. No. 201280008215.7; Dated Nov. 3, 2015.
Koren Office Action Appln. No. 10-2014-7020829; Dated Dec. 17, 2015.
International Search Report dated Jan. 3, 2013; PCT/CN2012/085860.
First Chinese Office Action dated Mar. 22, 2013; Appln. No. 201210226736.1
Second Chinese Office Action dated May 24, 2016; Appln. No. 201280008215.7.
Korean Office Action dated Jun. 30, 2016: Appln. No. 10-2014-7020829.
Japanese Office Action dated Sep. 5, 2016; Appln. No. 2015-518786.

* cited by examiner

MASK PLATE

TECHNICAL FIELD

Embodiments of the present invention relate to a mask plate.

BACKGROUND

During semiconductor manufacturing processes, it is a very important stage that a target substrate coated with photoresist is subjected to photolithography which employs a mask plate (reticle) to form a photolithography pattern and an etching process is conducted with the photolithography pattern so as to transfer a pattern on the mask plate onto the target substrate.

The photolithography process is such a process that masking exposure is conducted on a target substrate coated with photoresist through an exposure machine and a mask plate with a slit-like light-transparent region. Eventually, a pattern on the mask plate formed by the slit-like light-transparent region is transferred onto the target substrate, and the target substrate is etched, so as to obtain a slit-like pattern structure with a certain width on the target substrate.

In the field of microlithography, pattern structures drawn on target substrates are mostly linear, such as electrical circuit lines. As the semiconductor devices advanced to miniaturization gradually, minimization of the line width of patterns becomes a goal that manufactures are pursuing. However, owing to restriction upon the exposure precision of an exposure machine, the width of a pattern with a minimum width on a target substrate that has been produced at present is over 3 µm (more than 3 µm), and the line width of a corresponding slit-like light-transparent region on a mask plate is 3 to 5 µm.

For display products with smaller sizes, such as cell phones, reduction of the distance between electrical circuits or decrease of the width of electrical circuit lines is very important for increasing the resolution of products or the aperture ratio of pixels.

Implementing patterns with line widths in the order of micrometer is very common in the field of semiconductor. For example, the distance (a gap width) between the source electrode and the drain electrode of a thin film transistor (TFT) needs to be designed at the order of micron, or the line width of certain electrical circuit lines needs to be designed at the order of micron. Accordingly, the distance between the two edges of a slit-like light-transparent region on a mask plate needs to be designed at the order of micron as well. However, owing to restriction upon the exposure precision of an exposure machine, with an existing exposing system and a corresponding mask plate, on the premise that the photolithographic quality can be guaranteed, only patterns with line widths over 3 µm on a target substrate can be produced, and patterns with line widths of 3 µm or less cannot be obtained. By taking implementation of a gap between a source electrode and a drain electrode of a TFT as an example, the width of the gap between the source electrode and the drain electrode is as small as possible, so as to facilitate increase of the aperture ratio of pixels, and then, optical characteristics of the TFT is improved.

A mask plate for implementing patterns with a line width over 3 µm available currently is illustrated in FIG. 1, and the mask plate comprises a slit-like light-transparent region and lightproof regions, with the edges of the slit-like light-transparent region being arranged to have a linear structure. The vertical distance between the two edges of the slit-like light-transparent region as illustrated in FIG. 1 is 3 µm, and the resultant line width of a gap is no less than 3 µm. If a gap with a narrower line width is desired and the exposure light source of the exposure machine is not changed, what can be done is to decrease the width of the slit-like light-transparent region on the mask plate. However, a linear pattern on a target substrate is a diffraction stripe pattern resulting from diffraction of light emitted by the exposure machine, the diffraction occurs upon the light passing through the slit-like light-transparent region on the mask plate, and the diffraction stripe pattern is a linear pattern. The conditions for light diffraction comprise that the width of a gap (the width of a slit-like light-transparent region) is comparable to or almost the same as the wavelength of incident light (light emitted by an exposure machine). When the gap is too small, a scattering phenomenon of light will happen when the light passes through the gap, and no diffraction pattern can be formed. Even if a diffraction pattern can be formed, the conductive film layer between a source electrode and a drain electrode cannot be etched away completely due to the fact that light intensity received by photoresist on the target substrate is too small and this leads to an incomplete removal of photoresist for the pattern, thereby causing a short circuit between the source electrode and the drain electrode. Therefore, a pattern with a narrower line width cannot be implemented with a conventional mask plate.

SUMMARY

Embodiments of the present invention provide a mask plate, for implementing a pattern structure with a narrower line width on a target substrate.

According to an embodiment of the invention, there is provided a mask plate, comprising a slit-like light-transparent region and lightproof regions, with an edge of the slit-like light-transparent region being in a curve shape.

For example, the curve shape is in a zigzap shape or a wave-like shape. For example, a distance between any adjacent protruding sections at each of edges of the slit-like light-transparent region is equal, and a distance between any adjacent concaved sections at each of edges of the slit-like light-transparent region is equal.

For example, two edges of the slit-like light-transparent region are in a zigzag shape, a shape of a protruding section is an isosceles triangle with a raised angle as its vertex angle, and a shape of a concaved section is an isosceles triangle with a recessed angle as its vertex angle; or two edges of the slit-like light-transparent region are in a zigzag shape, a shape of a protruding section is an isosceles triangle with a raised angle as its vertex angle, and a shape of a concaved section is an isosceles trapezoid having a common waist with the isosceles triangle.

For example, the vertex angle of the isosceles triangle ranges between 15° and 75°.

For example, two edges of the slit-like light-transparent region are mirror-symmetric to each other.

For example, a distance between any opposed protruding sections at the two edges of the slit-like light-transparent region is equal; and/or a distance between any opposed concaved sections at the two edges of the slit-like light-transparent region is equal.

For example, a distance between any opposed concaved sections at the two edges is in the range of 1 µm to 3 µm, and a distance between any opposed protruding sections at the two edges is 3 µm.

For example, two ends of each of edges of the slit-like light-transparent region are convex or concave.

For example, when two ends of each of edges of the slit-like light-transparent region are concave, a shape of a concaved section is a right-angled triangle or a right-angled trapezoid.

For example, when two ends of each of edges of the slit-like light-transparent region are convex, a distance between opposed concaved sections at either end of the two edges of the slit-like light-transparent region is smaller than a distance between opposed concaved sections in a middle portion of the two edges of the slit-like light-transparent region; or a distance between opposed concaved sections of the slit-like light-transparent region is equal, and the distance between opposed protruding sections at either end of two edges of the slit-like light-transparent region is smaller than the distance between opposed protruding sections in a middle portion of the edges of the slit-like light-transparent region.

With the mask plate provided by embodiments of the invention, in the case that exposure parameters are constant, a pattern structure with a line width of 3 μm or less can be achieved.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Embodiments of the invention provide a mask plate, for implementing a pattern structure with a narrower line width on a target substrate.

The mask plate provided by an embodiment of the invention acts to implement a pattern structure with a line width that can be 3 μm or less on a target substrate. A mask plate provided by an embodiment of the invention is mainly used to implement a slit-like pattern structure. Accordingly, a light-transparent region on the mask plate is a slit-like light-transparent region. This is different from a slit-like light-transparent region in a conventional technology. An edge of the slit-like light-transparent region of the mask plate provided by an embodiment of the invention is in a curve shape, and for example, the curve shape may be a zigzag shape or a wavey shape.

Figure 1:
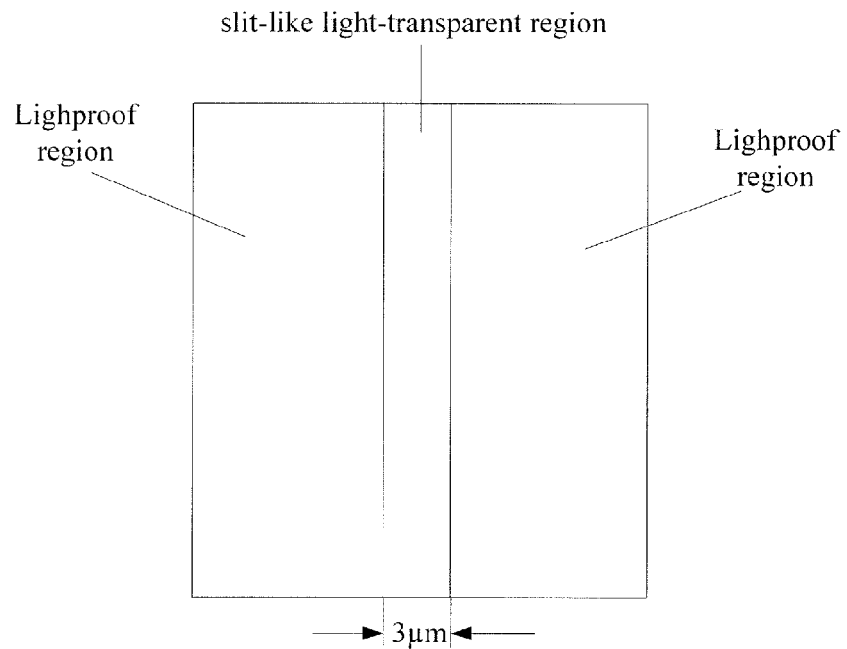
FIG. 1 is a structurally schematic view illustrating an existing mask plate for implementing a gap structure with a line width over 3 μm.

The edge recited in the embodiments of the invention refers in particular to a gap edge of a slit, namely a long side of a light-transparent region as illustrated in FIG. 1. This is because, the width of the slit of the mask plate stated in embodiments of the invention is in the order of micrometer, about a few micrometers, but the length of the slit, i.e., the length or width of the mask plate is in the order of meter, and a larger mask plate is several meters long. Therefore, the ratio of length to width of the slit is relatively large, and it is unnecessary to form a short side of the slit having a length of several micrometers to be rugged (irregular).

The principle to implement a pattern structure with a narrower line width through the above mask provided by embodiments of the invention will be simply explained below.

Figure 2:
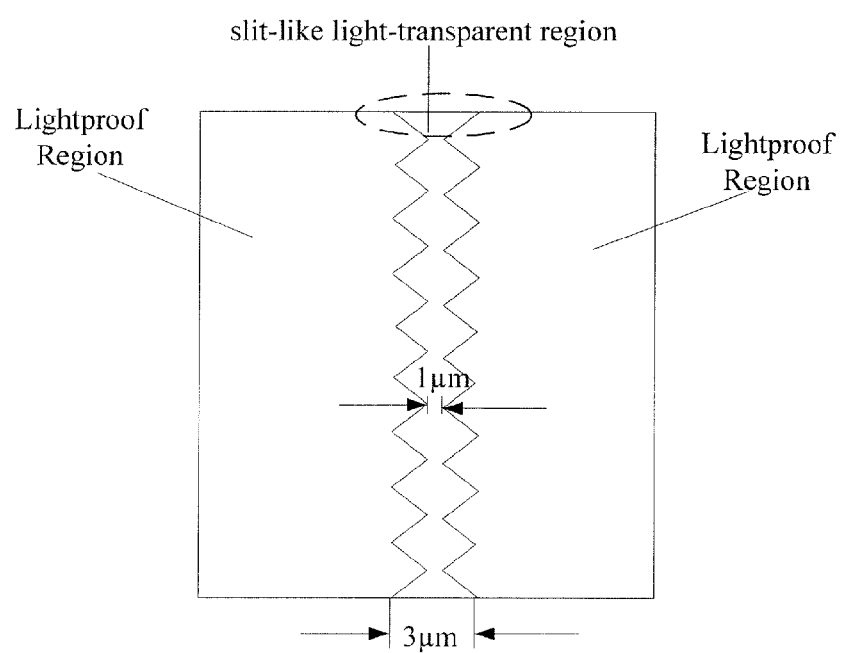
FIG. 2 is a structurally schematic view illustrating a mask plate with a zigzag-like gap structure provided by an embodiment of the invention.
Figure 3:
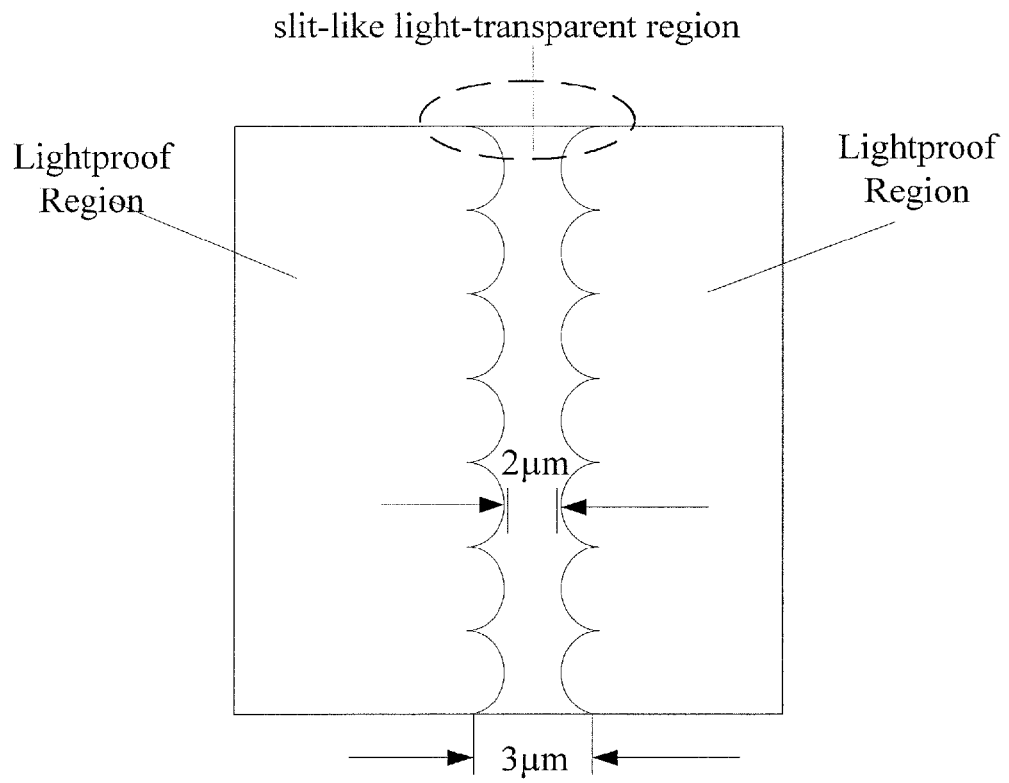
FIG. 3 is a structurally schematic view illustrating a mask plate with a wavy gap structure provided by an embodiment of the invention.

As illustrated in FIG. 2, two edges of a slit-like light-transparent region on a mask plate according to an embodiment of the invention are in a zigzag shape, or as illustrated in FIG. 3, two edges of a slit-like light-transparent region on a mask plate according to an embodiment of the invention are in a wavy shape. Exposure intensity for illuminating a target substrate can be decreased by the concaved sections of the two edges of the slit-like light-transparent region, so that the width of a gap to be formed on the target substrate through the mask plate can be decreased. Light transmittance is relatively strong at protruding sections of the two edges, thereby compensating the effect of the reduced exposure intensity incurred by the concaved sections. Thus, this makes the width of the gap formed on the target substrate by the protruding sections of the edges of the slit-like light-transparent region be smaller than the width between opposed, protruding sections of the two edges of the slit-like light-transparent region. A single-slit diffraction can be incurred by the gap between the concave edges, and the gap formed on the target substrate through the single-slit diffraction is a gap with a width that is uniform and less than 3 μm. It is verified through experiments that, within the mask plate provided by embodiments of the invention, the minimum gap width can be decreased up to 1 μm, thereby greatly reducing line width of a pattern structure formed on a target substrate. Thus, a pattern structure with a narrower line width can be realized.

The line width of the formed pattern structure or gap depends on the concaved degree of the concaved sections of the edges of the slit-like light-transparent region. In embodiments of the invention, when the minimum distance between any opposed, concaved sections at two edges of the slit-like light-transparent region is 1 μm and the maximum distance between any opposed, protruding sections at the two edges is 3 μm, it is guaranteed that a normal diffraction stripe (a slit structure) can be obtained by exposure. Namely, diffraction conditions can be met, and a diffraction stripe that is normal and subjected to complete exposure is attained. The complete exposure as stated above means that the exposed pattern can be etched away or retained entirely.

If positive photoresist is coated on a target substrate, then the film portion corresponding to the slit-like pattern that is transferred onto the target substrate through the mask plate is removed through a developing process with a developer, and the region may be an insulating region for isolating conductive layers in a semiconductor circuit. If a negative photoresist is coated on a target substrate, then the film portion corresponding to the slit-like pattern that is transferred onto the target substrate through the mask plate will not be removed through a developing process with a developer, and the rest regions will be removed by developing. Therefore, the remained film layer corresponding to the pattern may be a wire having a certain width.

Technical solutions provided by embodiments of the invention will be concretely described through accompanied drawings below.

Referring to FIG. 2, a mask plate provided by an embodiment of the invention comprises: a slit-like light-transparent region and lightproof regions that are formed on a substrate, the light-transparent region is formed in a certain pattern; two edges of the slit-like light-transparent region are in a curve shape. The curve shape may be a zigzag shape or a wave-like shape, or other shape.

For example, in order to make a slit-like structure or gap formed on a target substrate more regular (e.g., the width of the gap is uniform), the two edges of the slit-like light-transparent region are mirror-symmetric to each other.

For example, in order to further make the slit-like structure or gap formed on the target substrate more regular, the distance between any adjacent concaved sections on each of the edges of the slit-like light-transparent region is equal, and the distance between any adjacent protruding sections on each of the edges of the slit-like light-transparent region is equal.

For example, in order to still further make the slit-like structure or gap formed on the target substrate more regular, the distance between any opposed, concaved sections for the two edges of the slit-like light-transparent region is equal, and/or the distance between any opposed, protruding sections for the two edges of the slit-like light-transparent region is equal.

In order to achieve a gap with a homogeneous line width of less than 3 μm, the distance between any opposed, concaved sections at the two edges ranges is between 1 μm and 3 μm, and the distance between any opposed, protruding sections at the two edges is 3 μm. (The distance between any opposed, concaved sections at the two edges as illustrated in FIG. 2 is 1 μm, and the distance between any opposed, protruding sections at the two edges as illustrated in FIG. 3 is 2 μm.)

Where the distant between any opposed, protruding sections at the two edges is at a preset value, the larger the distance between any opposed, concaved sections at the two edges is, the wider the width of a formed gap is (the gap width is still within 3 μm), and the smaller the distance between the opposed, concaved sections at the two edges is, the narrower the width of the formed gap is. It is verified through experiments that, when any opposed, protruding sections at the two edges are away from each other at a distance of "a" and any opposed, concaved sections at the two edges are away from each other at a distance of "b," the width of the pattern formed on a target substrate is about (a+b)/2. Therefore, when a=3 μm and b=1 μm, the width of the pattern formed on the target substrate is about 2 μm.

For example, the two edges of the slit-like light-transparent region are in a zigzag shape, the shape of a concaved section is an isosceles triangle with a recessed angle as its vertex angle, and the shape of a protruding section is an isosceles triangle with a protruded angle as its vertex angle.

Or, the two edges of the slit-like light-transparent region are in a zigzag shape, the shape of a concaved section is an isosceles triangle with a recessed angle as its vertex angle, and the shape of a protruding section is an isosceles trapezoid having a common waist with the isosceles triangle.

When the edges of the slit-like light-transparent region are in a zigzag shape, the shape of a concaved section and of a protruding section is a triangle, and the distance between opposed, protruding sections at the two edges of the slit-like light-transparent region is at a preset value, the range of a vertex angle (an angle corresponding to the concaved section) may be changed, namely, the distance between opposed, concaved sections at the two edges may be changed so as to change the line width of a pattern formed on a target substrate.

For example, the vertex angle (an angle corresponding to the concaved section) of the triangle may be of any value between 15 degrees and 75 degrees. If a narrower gap is desired, the vertex angle should be larger to some extent, and if a wider gap is desired, the vertex angle should be smaller to some extent.

Likewise, it is also possible that the concaved degree of the concaved sections of slit-like edges is changed so as to change the distance between opposed, concaved sections at the two edges.

Figure 4:
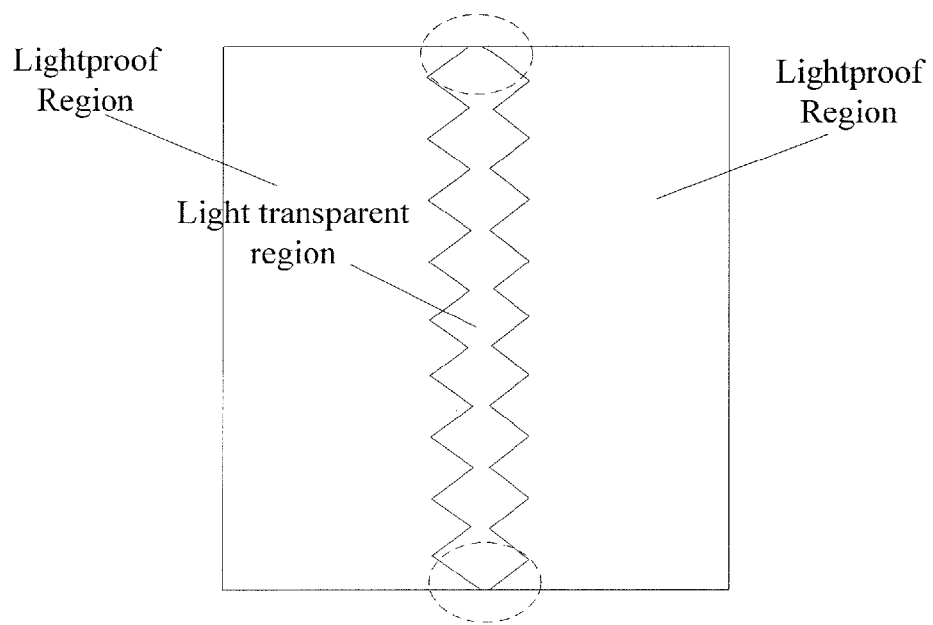
FIG. 4 is a structurally schematic view illustrating a mask plate in which a gap edge is concave at both ends thereof provided by an embodiment of the invention.

For example, two ends of each of the edges of a slit-like light-transparent region on a mask plate are concave or convex, and as illustrated within dotted lines in FIG. 4, two ends of each of the edges of the slit-like light-transparent region are constructed to be concave. Or, two ends of each of the edges are constructed to be convex, such as the configuration of two ends of each edge of a slit-like light-transparent region as illustrated within region defined by the dotted line in FIG. 2 or FIG. 3.

Figure 7:
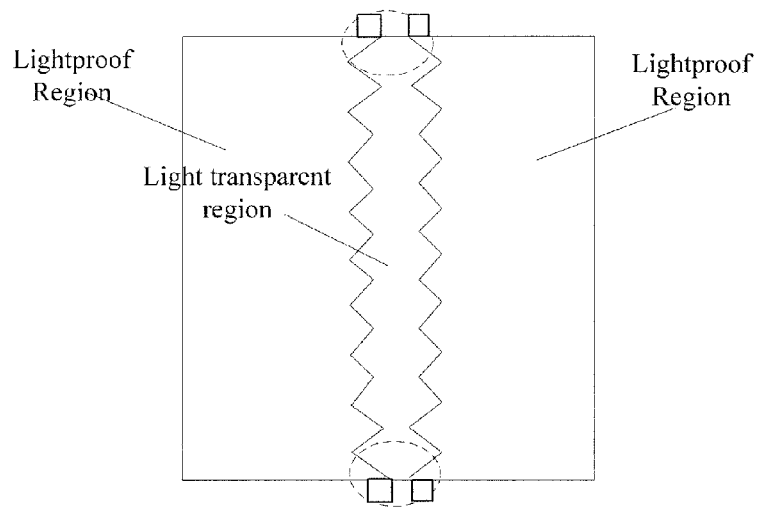
FIG. 7 is a view illustrating a mask plate, in which bumps are provided on two ends of an edge, provided by an embodiment of the invention.

In view of the phenomenon that two ends of each of the edges of a slit-like light-transparent region on a mask plate have stronger transmittance of light compared with the middle region of the light-transparent region of the mask plate, a protrusion section may be provided outside each of the two ends of each edge of the slit-like light-transparent region so as to reduce the exposure intensity at the two ends of the slit-like light-transparent region of the mask plate. Thus, this enables the line width of a gap formed on a target substrate to be uniform. There is no limitation on the shape of the bump, which may be a rectangle, as illustrated in FIG. 7, and may also be a circular arc, and the concrete shape and the size can be designed according to requirements.

When two ends of each edge of a slit-like light-transparent region are concave, the shape of a concaved section is a right-angled triangle or a right-angled trapezoid.

Figure 5:
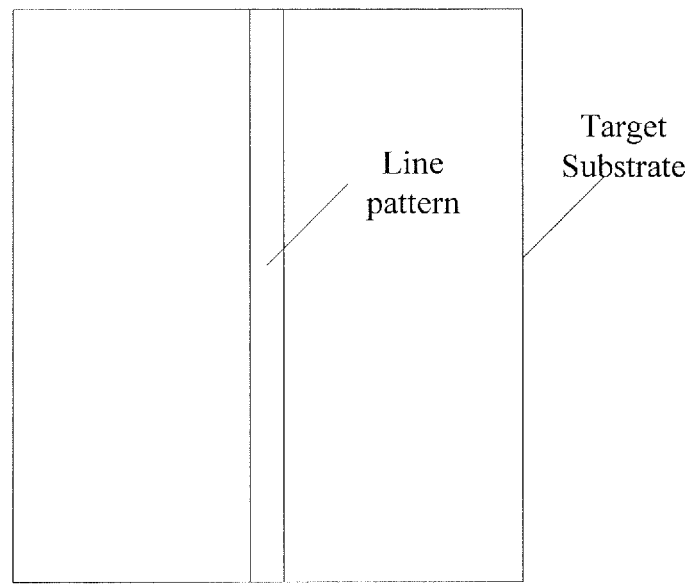
FIG. 5 is a schematic view illustrating formation of a linear pattern with a homogeneous width provided by an embodiment of the invention.
Figure 6:
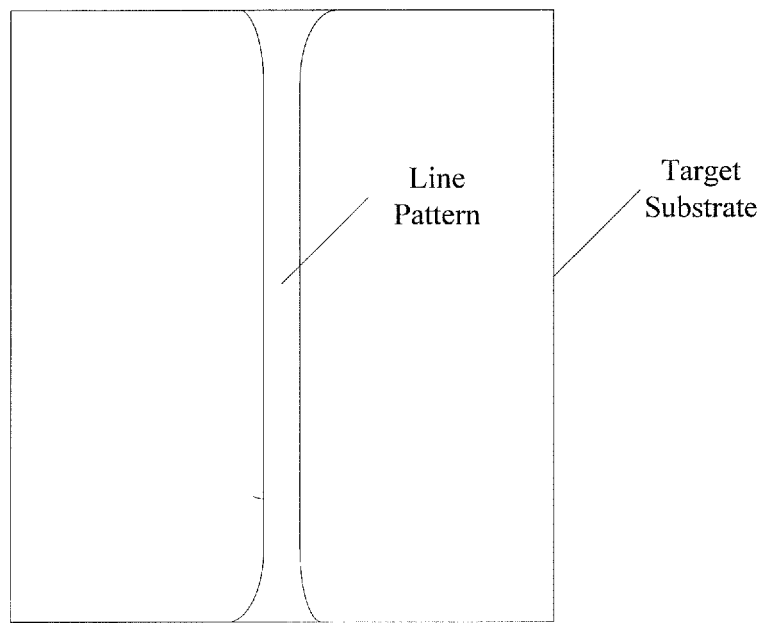
FIG. 6 is a schematic view illustrating formation of a linear pattern with a inhomogeneous width provided by an embodiment of the invention.

When two ends of each edge of a slit-like light-transparent region are concave, the line width of a gap formed on a target substrate is uniform, as illustrated in FIG. 5. When two ends of each edge of a slit-like light-transparent region are convex, the line width of a gap formed on a target substrate is non-uniform (the line width is inhomogeneous), as illustrated in FIG. 6, and the middle portion of the formed gap is narrower, and the portions at two ends thereof are wider. This is because, when two ends of each edge of a slit-like light-transparent region are formed to be convex, the exposure intensity at the middle region of the light-transparent region of the mask plate is lower than the exposure intensity at an exposed region at either end, and a slit formed on a target substrate has a smaller width in its middle region than at its end.

When two ends of each edge of a slit-like light-transparent region are formed to be convex, in order to avoid the formation of a gap with an inhomogeneous width as illustrated in FIG. 6, the concaved sections adjacent to the two ends of each edge of the slit-like light-transparent region may be formed to be steeper. Namely, when the two ends of each edge of a slit-like light-transparent region are convex, the distance between opposed concaved sections at either end of the two edges of the slit-like light-transparent region is smaller than the distance between opposed concaved sections in a middle portion of the two edges of the slit-like light-transparent region; or the distance between all concaved sections that are opposed in a slit-like light-transparent region is equal, and the distance between opposed protruding sections at either end of edges of slit-like light-transparent region is smaller than the distance between opposed protruding sections in the middle portion of the edges of slit-like light-transparent region.

In this way, the concaved section near either end of an edge of the slit-like light-transparent region functions to shield light to a greater degree, so that a gap formed on a target substrate is narrower, and the width of the entire gap that is formed eventually is uniform. Namely, the pattern as illustrated in FIG. 5 is formed.

The distance between any opposed concaved sections at two edges of a slit-like light-transparent region may be set to 1.5 μm, and the distance between any opposed protruding sections at the two edges may be set to 2.5 μm. The gap with a width of 2 μm can be formed on a target substrate likewise.

Hereinafter, the technical solutions provided by embodiments of the invention will be described in connection with the accompanied drawings with reference to an example of the gap between a source electrode and a drain electrode for a TFT (i.e., a channel region).

Figure 8:
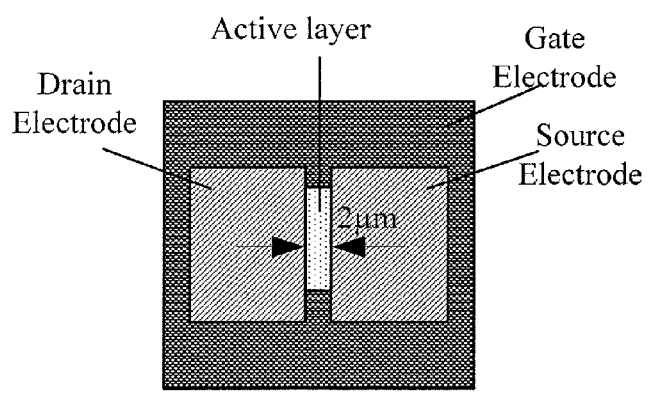
FIG. 8 is a schematic view illustrating formation of a TFT structure with a width of less than 3 μm provided by an embodiment of the invention.

As illustrated in FIG. 8, which is a schematically, partially structural view illustrating a TFT provided by an embodiment of the invention, specifically, an active layer is formed over a gate electrode, and a source and drain film layer is formed on the active layer. A part of the active layer is exposed through the gap between a source electrode and a drain electrode. The narrower the gap between the source electrode and the drain electrode is, the smaller the formed TFT is, the larger the aperture ratio of the pixel in which the TFT is located is, and the better the light transmission of the product is. However, how to achieve the minimization of the gap between the source electrode and the drain electrode is a technical difficulty point in the industry. Currently, the gap between the source electrode and the drain electrode is affected by exposure precision, and the formed gap is generally in the range of 3 μm to 5 μm. If the width of the gap is decreased by 1 μm, the aperture ratio of the pixel for a product can be raised greatly, thereby promoting the competitive power of the product.

In an embodiment of the invention, a gap with a line width of less than 3 μm between a source electrode and a drain electrode in FIG. 8 can be implemented with a mask plate in which an edge of a slit-like light-transparent region is in a zigzag shape as illustrated in FIG. 2.

Cross-sections of the concaved sections and the protruding sections of the zigzag shape taken by the edge of the slit-like light-transparent region appears to be triangles, such as isosceles triangles, and the protruding sections in correspondence with isosceles triangles can cause the width of the gap between the source electrode and the drain electrode formed on an array substrate to be more homogeneous.

All the concaved sections at each of edges of the slit-like light-transparent region have corresponding triangles with an identical vertex angle, all the protruding sections have corresponding triangles with an identical vertex angle, and the vertex angle of a triangle corresponding to a concaved section is the same as the vertex angle of a triangle corresponding to a protruding section. Further, the distance between any two protruding sections that are opposed at the two edges is equal, and the distance between any two concaved sections that are opposed at the two edges is equal. Such a design arrangement facilitates the formation of a gap with a uniform width.

Given that the distance between any two concaved sections that are opposed at the two edges is equal, if some opposed concaved sections at the two edges have larger vertex angles, and some opposed concaved sections have smaller vertex angles, then the area of a recessed region corresponding to a concaved section with a larger vertex angle is larger as well, the light passing through a gap corresponding to such recessed region is weaker, and a pattern formed on a target substrate is narrower. Accordingly, the area of the recessed region corresponding to a concaved section with a smaller vertex angle is smaller, the light passing through a gap corresponding to the recessed region is stronger, and a pattern formed on a target substrate is wider. If the pattern formed on the target substrate is an insulating gap in a metal film layer, then when the insulating gap in the metal film layer is narrower, the metal film layers on the two sides of the gap may be conductively connected. Thus, the structure of the device is changed, and this leads to an undesired short circuit.

Given that the distance between any two protruding sections that are opposed at the two edges is equal, if some opposed concaved sections at the two edges have larger vertex angles, and some opposed concaved sections have smaller vertex angles, then the area of the recessed region corresponding to a concaved section with a larger vertex angle is smaller, the light passing through a gap corresponding to the recessed region is stronger, and a pattern formed on a target substrate is wider. Accordingly, the area of the recessed region corresponding to a concaved section with a smaller vertex angle is larger, the light passing through a gap corresponding to the recessed region is weaker, and a pattern formed on a target substrate is narrower. If the pattern formed on the target substrate is an insulating gap in a metal film layer, then when the insulating gap for the metal film layers is narrower, the metal film layers on two sides of the gap may be conductively connected. Thus, the structure of the device is changed, and this leads to an undesired short circuit.

The light-transparent regions between opposed protruding sections at the two edges of the slit-like light-transparent region allow light with a sufficient light intensity to pass therethrough; and the light-transparent regions between concaved sections on the mirror-symmetric edges of the slit-like light-transparent region act to allow transmission of light on one hand, and on the other hand, can serve to reduce the exposure intensity from an exposure machine. The protruding sections and the concaved sections that are mirror-symmetric to each other at the edges of the slit-like light-transparent region act collectively, so that the exposure intensity transmitted by the light-transparent region is degraded, and an effective gap to be formed is relatively narrow. The effective gap corresponds to a region that can be etched away fully, and no short circuit between the source electrode and the drain electrode will be produced.

When the distance between opposed protruding sections at the two edges is decided, the size of the vertex angle of a concaved section of a zigzag-shaped edge of the slit-like light-transparent region determines the distance between concaved sections that are mirror-symmetric to each other. The vertex angle of a triangle corresponding to the concaved section ranges from 15 degrees to 75 degrees.

Figure 9:
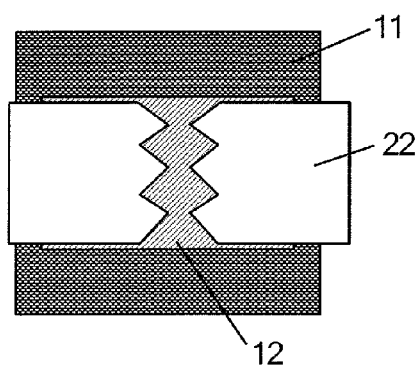
FIG. 9 is a systematically, structurally schematic view illustrating a mask plate, of which an edge is convex at both ends of it, and a TFT provided by an embodiment of the invention.

FIG. 9 is a systematically structural schematic view illustrating a mask plate, in which an edge is convex at either end of it, and a TFT provided by an embodiment of the invention. After an exposure machine and the above mask plate according to an embodiment of the invention have been amounted, an array substrate prepared in advance is placed in an exposure chamber and subjected to a masking exposure process. The array substrate is a substrate on which a gate electrode 11 and an active layer (not illustrated in FIG. 9) are formed; on the active layer, a conductive film layer 12 is provided for forming a source electrode and a drain electrode, and the conductive film layer is coated with positive photoresist thereon. A mask plate 22 is placed directly above the substrate with the conductive layer 12 formed thereon. With the exposure via the mask plate 22, a gap having a line width of 2 μm is formed in the positive photoresist, and through an etching process, a region on the array substrate in correspondence with the slit-like light-transparent region on the mask plate 22 is etched away so as to form a gap between the source electrode and the drain electrode as illustrated in FIG. 8. The gap is 2 μm in width, and a gap between the source electrode and the drain electrode for each TFT is decreased by 1 μm at least. For a display product with a small screen and a high resolution, the aperture ratio of a pixel will be raised greatly.

It is to be noted that, where it is desired to produce conductive strips with a gap of about 2 μm therebetween by etching, it is necessary to coat negative photoresist on a conductive film layer.

The distance between opposed concaved sections at the two edges of the light-transparent region is not limited to 1 μm, and the distance between opposed protruding sections at the two edges is not limited to 3 μm. For example, the following arrangement is available: the distance between opposed concaved sections at the two edges is 1.5 μm while the distance between opposed protruding sections at the two edges is 2.5 μm.

Both ends of each edge of a slit-like light-transparent region according to an embodiment of the invention are designed to be convex. That is, there is no concaved section for shielding light at the two ends of each edge of the slit-like light-transparent region. This can cause a stronger exposure intensity of the transmitted light at the two ends of the edges of the slit-like light-transparent region, and the formed gap is narrow in the middle while wide at both ends. This results in the fact that the shape of a source electrode and a drain electrode will be irregular as well.

Figure 10:
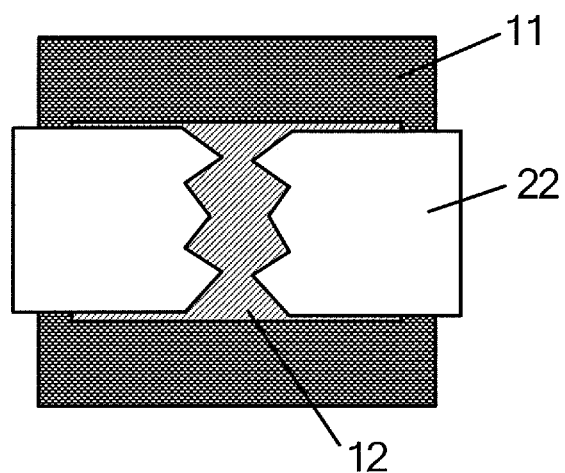
FIG. 10 is a systematically, structurally schematic view illustrating another mask plate, of which an edge is convex at both ends of it, and a TFT provided by an embodiment of the invention.

In order to solve such a problem that, where both ends of each edge of the slit-like light-transparent region are convex, the width of a formed gap between a source electrode and a drain electrode varies, another mask design manner is provided by an embodiment of the invention. In detail, the design differs from the edge arrangement mode of the slit-like light-transparent region for the mask plate as illustrated in FIG. 9 in that, the distance between opposed concaved sections at either end of the two edges of a slit-like light-transparent region is smaller than the distance between opposed concaved sections in the middle portion of the two edges of the slit-like light-transparent region, and the formed pattern is illustrated in FIG. 10. The distance between all the opposed concaved sections of a slit-like light-transparent region is equal, and the distance between opposed protruding sections at either end of the edges of the slit-like light-transparent region is smaller than the distance between opposed protruding sections in the middle portion of the edges of the slit-like light-transparent region, and the formed pattern is illustrated in FIG. 11.

Figure 11:
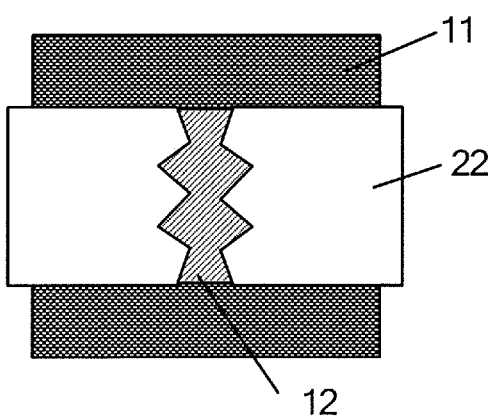
FIG. 11 is a systematically, structurally schematic view illustrating another mask plate, of which an edge is convex at both ends of it, and a TFT provided by an embodiment of the invention.

When the design mode of the light-transparent region of the mask plate as illustrated in FIG. 10 or FIG. 11 is compared to the mask design mode as illustrated in FIG. 9, a gap formed by the mask plate has a relatively smaller width at either end, so that the whole gap is kept at a uniform width.

Figure 12:
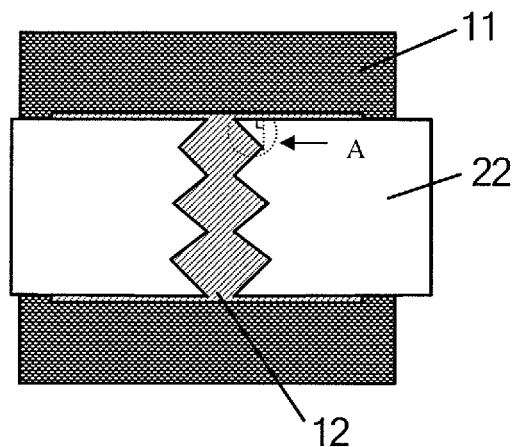
FIG. 12 is a systematically, structurally schematic view illustrating a mask plate, of which an edge is concave at both ends of it, and a TFT provided by an embodiment of the invention.

In order to solve such a problem that, where both ends of each edge of the slit-like light-transparent region are convex, the width of a formed gap between a source electrode and a drain electrode varies, another mask design manner is provided by an embodiment of the invention. In detail, the mask design differs from the arrangement mode of the light-transparent region of the mask plate illustrated in FIG. 9 in that, the two ends of an edge of a slit-like light-transparent region are concave. A concaved portion may be of one right-angled triangle as illustrated in FIG. 12 (e.g., the portion denoted by a broken-line box A in FIG. 12), or of a right-angled trapezoid (e.g., the portion denoted by a broken-line box B in FIG. 13), with a side corresponding to the right angle being disposed on the outmost side. Further, the inclination angle of a sloping side of the right-angled triangle or the right-angled trapezoid is the same as the inclination angle for a triangle in the middle of the light-transparent region (the inclination angle is not the above vertex angle).

Figure 13:
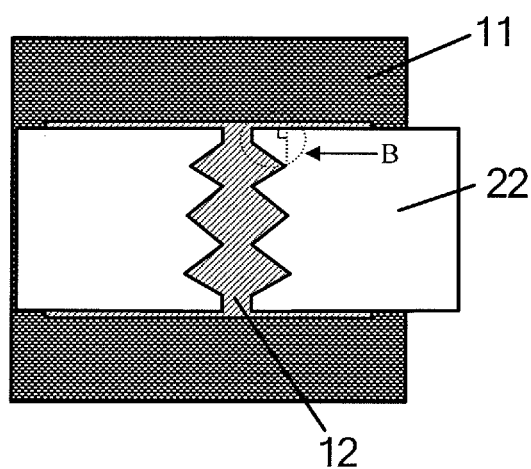
FIG. 13 is a systematically, structurally schematic view illustrating another mask plate, of which an edge is concave at both ends of it, and a TFT provided by an embodiment of the invention.

When the design mode of the light-transparent region of the mask plate as mentioned as above is compared with the mask design mode as illustrated in FIG. 9, a gap formed in this design mode has a relatively smaller width at both ends, so that the whole gap is kept at a uniform width. Furthermore, when the mask design mode in FIG. 12 or FIG. 13 is compared with that as illustrated in FIG. 10 or FIG. 11, this design mode is simple. Furthermore, the design mode of every, mask plate is not limited to one kind, and the mask design mode as illustrated in FIG. 7 can be used in combination with the design modes in any of FIGS. 9 to 13.

Figure 14:
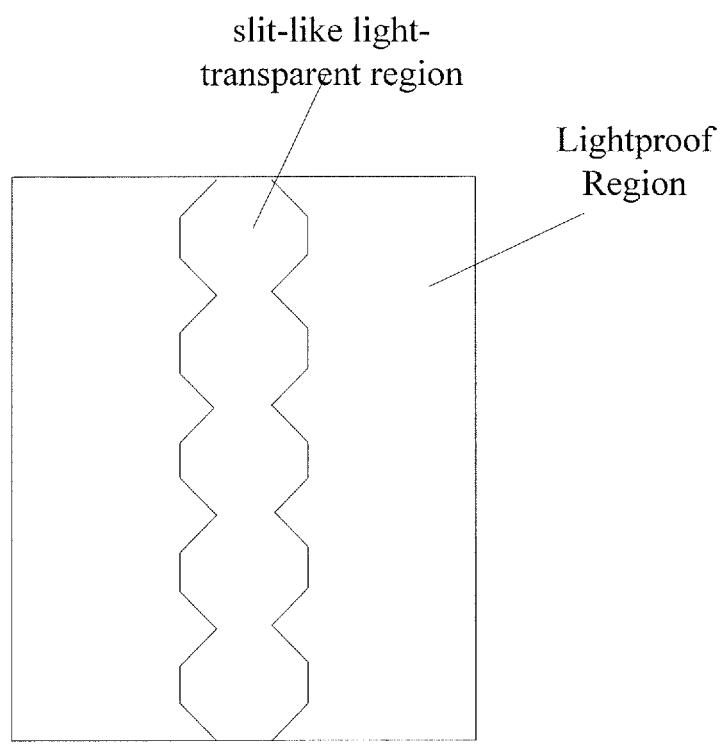
FIG. 14 is a structurally schematic view illustrating another mask plate provided by an embodiment of the invention.

It is to be noted that, in a design mode of a mask plate provided by an embodiment of the invention, protruding sections may be of an isosceles trapezoid, and concaved sections may be of an isosceles triangle, as illustrated in FIG. 14. Likewise a pattern structure with a line width of 3 µm or less can be formed through the structure. The principle to implement a pattern structure of 3 µm or less with the mask plate as illustrated in FIG. 14 is similar to that with the mask plate as illustrated in FIG. 12 and FIG. 13, and details are omitted here.

Regarding the mask plates provided by embodiments of the invention, the manufacturing process for them may be the same as an existing process for manufacturing a plate mask.

For example, the manufacturing process may be implemented by the following manner in steps.

Step 1, a metal chromium film layer is evaporated on a surface of a glass substrate.

Step 2, imaging is conducted on the metal chromium film layer so as to form a pattern corresponding to the slit-like light-transparent region as stated above.

Edges of the slit-like light-transparent region that has a zigzag-shaped structure as stated above are formed in the metal chromium film layer of the mask plate. Specifically, it is possible that an image of the pattern corresponding to the slit-like light-transparent region is formed on the metal chromium film layer by using electron beams.

Step 3, a pattern is formed. It is possible that the chromium film layer corresponding to the light-transparent region is etched away through an etching process, so that the region becomes the slit-like light-transparent region.

It is to be noted that, with design modes of the mask plate provided by embodiments of the invention, any pattern structure with a width of 3 µm or less can be implemented, and especially in the technical field of semiconductor manufacturing process, it is possible that any wire having a width of 3 µm or less can be implemented, or any gap between wires having a width of 3 µm or less can be implemented. Furthermore, an edge of the slit-like light-transparent region provided by embodiments of the invention is in a concave-convex shape, which may be a concave-convex shape with a regular pattern, as long as it is ensured that the line width is lower than 3 µm and the line width of a formed graph is also lower than 3 µm.

In summary, regarding the mask plate provided by embodiments of the invention, which comprises a slit-like light-transparent region and lightproof regions, an edge of the slit-like light-transparent region is convex, protruding sections of the edge can serve to shelter against the light intensity of an exposure machine so that a gap formed on a target substrate has a narrower width, and the protruding sections can serve to guarantee smooth passing of light at a certain optical intensity. The pattern formed by such an arrangement mode of alternate concaved sections and protruding sections at an edge of the slit-like light-transparent region has a narrower gap, and as compared with the conventional technology, a pattern structure with a line width of 3 µm or less can be implemented through a process using an exposure mask.

The foregoing are merely exemplary embodiments of the invention, but are not used to limit the protection scope of the invention. The protection scope of the invention is determined by attached claims.

The invention claimed is:

1. A mask plate, comprising a slit-like light-transparent region and lightproof regions, and bumps that are disposed outside ends of each of edges of the slit-like light-transparent region respectively, wherein an edge of the slit-like light-transparent region is in a curve shape.

2. The mask plate as claimed in claim 1, wherein the curve shape is a zigzag shape or a wave-like shape.

3. The mask plate as claimed in claim 2, wherein a distance between any adjacent protruding sections at each of edges of the slit-like light-transparent region is equal, and a distance between any adjacent concaved sections at each of edges of the slit-like light-transparent region is equal.

4. The mask plate as claimed in claim 3, wherein two edges of the slit-like light-transparent region are in a zigzag shape, a shape of a protruding section is an isosceles triangle with a raised angle as its vertex angle, and a shape of a concaved section is an isosceles triangle with a recessed angle as its vertex angle; or
   two edges of the slit-like light-transparent region are in a zigzag shape, a shape of a protruding section is an isosceles triangle with a raised angle as its vertex angle, and a shape of a concaved section is an isosceles trapezoid having a common waist with the isosceles triangle.

5. The mask plate as claimed in claim 3, wherein two ends of each of edges of the slit-like light-transparent region are convex or concave.

6. The mask plate as claimed in claim 2, wherein two edges of the slit-like light-transparent region are in a zigzag shape, a shape of a protruding section is an isosceles triangle with a raised angle as its vertex angle, and a shape of a concaved section is an isosceles triangle with a recessed angle as its vertex angle; or
   two edges of the slit-like light-transparent region are in a zigzag shape, a shape of a protruding section is an isosceles triangle with a raised angle as its vertex angle, and a shape of a concaved section is an isosceles trapezoid having a common waist with the isosceles triangle.

7. The mask plate as claimed in claim 6, wherein the vertex angle of the isosceles triangle ranges between 15° and 75°.

8. The mask plate as claimed in claim 2, wherein two edges of the slit-like light-transparent region are mirror-symmetric to each other.

9. The mask plate as claimed in claim 2, wherein a distance between any opposed protruding sections at two edges of the slit-like light-transparent region is equal; and/or
   a distance between any opposed concaved sections at two edges of the slit-like light-transparent region is equal.

10. The mask plate as claimed in claim 2, wherein a distance between any opposed concaved sections at the two edges is in the range of 1 µm to 3 µm, and a distance between any opposed protruding sections at the two edges is 3 µm.

11. The mask plate as claimed in claim 2, wherein two ends of each of edges of the slit-like light-transparent region are convex or concave.

12. The mask plate as claimed in claim 1, wherein two edges of the slit-like light-transparent region are mirror-symmetric to each other.

13. The mask plate as claimed in claim 1, wherein a distance between any opposed protruding sections at two edges of the slit-like light-transparent region is equal; and/or
   a distance between any opposed concaved sections at two edges of the slit-like light-transparent region is equal.

14. The mask plate as claimed in claim 1, wherein a distance between any opposed concaved sections at the two edges is in the range of 1 m to 3 m, and a distance between any opposed protruding sections at the two edges is 3 m.

15. The mask plate as claimed in claim 1, wherein two ends of each of edges of the slit-like light-transparent region are convex or concave.

16. The mask plate as claimed in claim 15, wherein when the two ends of each of edges of the slit-like light-transparent region are concave, a shape of concaved sections is a right-angled triangle or a right-angled trapezoid.

17. The mask plate as claimed in claim 15, wherein when two ends of each of edges of the slit-like light-transparent region are convex, a distance between opposed concaved sections at either end of two edges of the slit-like light-transparent region is smaller than a distance between opposed concaved sections in a middle portion of the two edges of the slit-like light-transparent region; or a distance between any opposed concaved sections of the slit-like light-transparent region is equal, and a distance between opposed protruding sections at either end of two edges of the slit-like light-transparent region is smaller than a distance between opposed protruding sections in a middle portion of the edges of the slit-like light-transparent region.

\* \* \* \* \*